(12) United States Patent
Tellkamp

(10) Patent No.: US 7,095,121 B2
(45) Date of Patent: Aug. 22, 2006

(54) METALLIC STRAIN-ABSORBING LAYER FOR IMPROVED FATIGUE RESISTANCE OF SOLDER-ATTACHED DEVICES

(75) Inventor: John P. Tellkamp, Denison, TX (US)

(73) Assignee: Texas Instrument Incorporated, Dallas, TX (US)

( * ) Notice: Subject to any disclaimer, the term of this patent is extended or adjusted under 35 U.S.C. 154(b) by 0 days.

(21) Appl. No.: 10/205,455

(22) Filed: Jul. 25, 2002

(65) Prior Publication Data

US 2003/0214037 A1 Nov. 20, 2003

Related U.S. Application Data

(60) Provisional application No. 60/381,420, filed on May 17, 2002.

(51) Int. Cl.
*H01L 23/48* (2006.01)

(52) U.S. Cl. .................. 257/781; 257/779; 257/764; 438/614

(58) Field of Classification Search ......... 257/737–738, 257/779, 783, 761–762, 767, 781, 764; 438/614
See application file for complete search history.

(56) References Cited

U.S. PATENT DOCUMENTS 6,255,723 B1 7/2001 Light et al.
6,489,229 B1 * 12/2002 Sheridan et al. ............ 438/614

FOREIGN PATENT DOCUMENTS

| EP | 0 753 990 A1 | 1/1997 |
| JP | 01 081264 A | 3/1989 |
| JP | 09 129647 A | 5/1997 |
| JP | 2001 024021 | 1/2001 |

OTHER PUBLICATIONS

"Biocompatibilty Evaluation of Nickel–titanium Shape Memory Metal Alloy", Jorma Ryhanen, 1999, Oulu University Library, Oulu, Finland.
"Effect of Thermomechanical Treatment on the Two–way Shape Memory Effect of NITI Alloy Spring", Zhiguo Wang et al, Materials Letters, North Holland Publishing Company, Amsterdam, NL, vol. 54. No. 1 May 2002, pp. 55–61.

* cited by examiner

*Primary Examiner*—Luan Thai
(74) *Attorney, Agent, or Firm*—Wade James Brady, III; Frederick J. Telecky, Jr.

(57) ABSTRACT

An integrated circuit chip 501 has a plurality of contact pads (FIG. 5B) to be connected by reflow attachment 510 to outside parts. The chip comprises a deposited layer 505 of nickel/titanium alloy on each of the pads; the alloy has a composition and crystalline structure operable in reversible phase transitions under thermomechanical stress, whereby mechanical strain is absorbed by the alloy layer. Preferably, the alloy has between 55.0 and 56.0 weight % nickel, between 44.0 and 45.0 weight % titanium, and a thickness in the range from 0.3 to 6.0 μm, recrystallized after deposition in a temperature range from 450 to 600° C. for a time period between 4 and 6 min. A layer 506 of solderable metal is on the alloy, operable as diffusion barrier after reflow attachment.

24 Claims, 4 Drawing Sheets

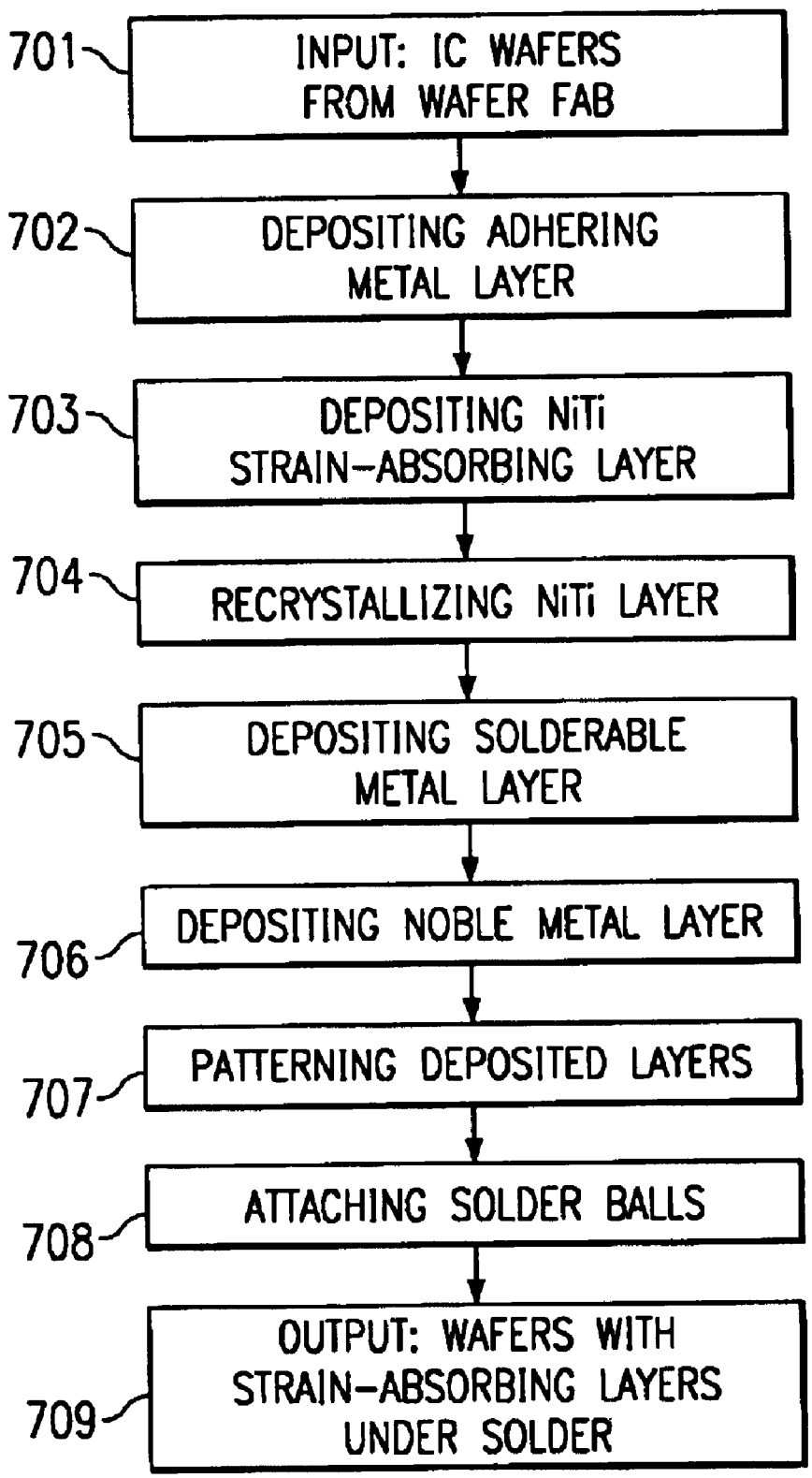

METALLIC STRAIN-ABSORBING LAYER FOR IMPROVED FATIGUE RESISTANCE OF SOLDER-ATTACHED DEVICES

This application claims priority under 35 USC §119 (e)(1) of provisional application number 60/381,420 filed May 17, 2002.

FIELD OF THE INVENTION

The present invention is related in general to the field of semiconductor devices and processes and more specifically to the structure of metallurgical interconnection pads for flip-chip assembly of semiconductor devices.

DESCRIPTION OF THE RELATED ART

The structure of contact pad metallizations and solder bumps for connecting integrated circuit (IC) chips to semiconductor packages or outside parts, as well as the thermomechanical stresses and reliability risks involved, have been described in a series of detailed publications by the International Business Machines Corporation in 1969 (IBM J. Res. Develop., Vol. 13, pp. 226–296).

During and after assembly of the IC chip to an outside part such as a substrate or circuit board by solder reflow, and then during device operation, significant temperature differences and temperature cycles appear between semiconductor chip and the substrate. The reliability of the solder joint is strongly influenced by the coefficients of thermal expansion of the semiconductor material and the substrate material. For example, there is more than one order of magnitude difference between the coefficients of thermal expansion of silicon and FR-4. This difference causes thermomechanical stresses, which the solder joints have to absorb. Detailed calculations, in the literature cited above and in other publications of the early 1980's, involving the optimum height and volume of the solder connection and the expected onset of fatigue and cracking proposed a number of solder design solutions.

The fabrication methods and reliability problems involving flip-chips re-appear in somewhat modified form for ball-grid array type packages. In their book "Chip Scale Package" (McGraw-Hill, 1999), John H. Lau and Shi-Wei Ricky Lee describe various semiconductor devices and packages of contemporary "chip-scale" families, as they are fabricated by a number of semiconductor companies worldwide. The newest designs and concepts in microelectronics assembly and packaging are aiming for a package with a planar area not substantially greater than the silicon chip itself, or at most 20% larger area. This concept, known as Chip-Scale Package (CSP), is finding particular favor with those electronics industries where the product size is continually shrinking such as cellular communications, pagers, hard disk drivers, laptop computers and medical instrumentation. Most CSP approaches are based on flip-chip assembly with solder bumps or solder balls on the exterior of the package, to interface with system or wiring boards.

The chip-to-be-flipped may be attached to a second interconnection surface such as an interposer, or alternatively, coupled directly to a printed circuit board (PCB). Attaching the flip-chip to the next interconnect is carried out by aligning the solder bumps or balls on the chip to contact pads on the second level interconnection and then performing a second solder reflow operation. During the reflow, the bumps or balls liquefy and make a bond to the next interconnect level which has pads or traces to receive the solder. Following the solder reflow step, flip-chips often use a polymeric underfill between the chip and the interposer or PCB to alleviate mechanical stress caused by the mismatch in the coefficients of thermal expansion (CTE) between the semiconductor chip, the interposer, if any, and the PCB. Many reliability problems occur due to the stress placed on the solder bumps or balls when the integrated circuit is cycled from hot to cool during operation. When another set of solder balls on the opposite side of the interposer is employed to complete the bonding process to a PCB, this second set may also be affected by similar stress and reliability problems.

One method of drastically reducing the thermomechanical stress on the solder bumps has been utilized in Tessera's Micro-Bass Grid Array packages. A sheet-like compliant elastomer substantially de-couples the solder bumps, affixed to the outside PCB, from the IC chip and the interposer, thus relieving the thermal mismatch. Among the drawbacks of this method are assembly hurdles and cost considerations.

Another method aims at absorbing part of the thermomechanical stress on the solder joints by plastic material surrounding the joints and filling the gap between chip and substrate. See for instance, U.S. Pat. No. 6,228,680, issued on May 8, 2001; U.S. Pat. No. 6,213,347, issued on Apr. 10, 2001, and U.S. Pat. No. 6,245,583, issued on Jun. 12, 2001 (Thomas et al., Low Stress Method and Apparatus for Underfilling Flip-Chip Electronic Devices). However, the underfilling method represents an unwelcome process step after device attachment to the motherboard.

Another method applies a polymer layer on top of the protective overcoat with the aim of reducing the stress to the overcoat perimeter and the dielectric material underlying the contact pad. See for instance the publication "A Silicon and Aluminum Dynamic Memory Technology" by Richard A. Larsen (IBM J. Res. Develop., vol.24, May 1980, pp. 268–282). The article includes description of a flip-chip packaging technology using a solder bump on an under-bump metallization, which is resting its perimeter on a thick polyimide layer. The bump structure is often supported by another polyimide layer.

An urgent need has arisen for a coherent, low-cost method of fabricating flip-chip assembly of semiconductor devices offering a fundamental metallurgical solution of solder-to-metal interconnection and thermomechanical stress reliability. The method should be flexible enough to be applied for different semiconductor product families and a wide spectrum of design and process variations. Preferably, these innovations should be accomplished using the installed equipment base so that no investment in new manufacturing machines is needed.

SUMMARY OF THE INVENTION

An integrated circuit chip is described which has a plurality of contact pads to be connected by reflow attachment to outside parts. The chip comprises a deposited layer of nickel/titanium alloy on each of the pads; the alloy has a composition and crystalline structure operable in reversible phase transitions under thermomechanical stress, whereby mechanical strain is absorbed by the alloy layer. Preferably, the alloy has between 55.0 and 56.0 weight % nickel, between 44.0 and 45.0 weight % titanium, and a thickness in the range from <0.3 to 6.0 µm, recrystallized after deposition in a temperature range from 450 to 600° C. for a time period between 4 and 6 min. A layer of solderable metal is on the alloy, operable as diffusion barrier after reflow attachment.

The geometries of the nickel/titanium layer and the reflow attachment are the same at the location of the highest stress.

However, the crystalline structure of the nickel/titanium is martensite, having a Lower Superelastic Plateau Stress (yield stress) lower than the yield stress of the reflow attachment selected. Thereby, the mean fatigue life of devices (number of temperature cycles to 63.2% failure of the attachment) is significantly extended.

The preferred alloy of the present invention has 55.5±0.5 weight % nickel (Ni) and 44.5±0.5 weight % titanium (Ti) (and maximal 0.05% oxygen, iron, and carbon each).

According to the invention, the NiTi and the reflow alloy are jointly selected so that at the lower temperatures of the temperature cycle, the NiTi is martensitic with a yield strength below the yield strength of the reflow alloy. Consequently, the NiTi will yield preferentially. At the higher temperatures of the temperature cycle, the NiTi will turn austenitic with a yield strength higher than the reflow alloy. Consequently, the reflow alloy will yield preferentially.

The net effect of this trade-off in the joint yielding characteristic is an improvement of the total number of temperature cycles to failure. The plastic deformation is distributed over a larger volume of materials.

Fabrication of NiTi layers for IC chips and recrystallization to achieve martensite/austenite transformation in the temperature range of electronic device application are essential aspects of the present invention.

According to the invention, NiTi is applied on each device contact pad as a thin layer together with an outside solderable layer. The bulk of the interconnection of the device to an external part (such as a printed circuit board made of FR4), is still a reflowable solder "ball" of a suitable tin alloy. An example of how the invention functions can be seen in a typical qualification test: After attachment of the device to the board, the system is subjected to repeated temperature cycles from −40 to +125° C. in 15 min ramps, causing a strain rate of about 13·10E-6/° C. due to the difference of the coefficients of thermal expansion between the silicon chip and the FR4board.

In the temperature cycle from −40 to +125° C., the NiTi lower superelastic stress must be below the solder yield stress in order to be effective for postponing failures. The solder yield stress has been published, for two preferred tin alloy solders 63Sn/37Pb and 95.75/Sn3.5Ag/0.75Cu, by Masazumi Amagai in "Chip Scale Package Solder Joint Reliability Modeling and Material Characterization" (J. Japan Inst. Electronics Packaging, vol.3, no.1., pp. 45–56, January 2000). Using these data and plotting the yield stress for these two solder alloys in the temperature interval from −40 to +125° C., results in FIG. 3. The yield stress is measured in MPa.

It is an aspect of the present invention to provide the methodology/concept of determining the TiNi composition and crystallinity based on the desired improvement of the mean fatigue life of the device interconnection after competing a given number of cycles in the given temperature range.

Another aspect of the invention is to provide the stress-relieving structure of the device interconnection comprising the TiNi layer.

Another aspect of the invention is to provide the process flow for the fabrication of the TiNi layer and the complete interconnection structure.

It is a technical advantage of the present invention that a wide variety of solder alloys can be employed for the provided TiNi layers and techniques.

Other technical advantages of the present invention include an improved reliability of the assembled device without the need of a polymer interface layer or a polymer underfill for the bump-assembled device, reducing the manufacturing cost.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 7 is a schematic and simplified block diagram of the wafer-level process flow for fabricating the NiTi layer on IC contact pads.

DETAILED DESCRIPTION OF THE PREFERRED EMBODIMENTS

Figure 1:
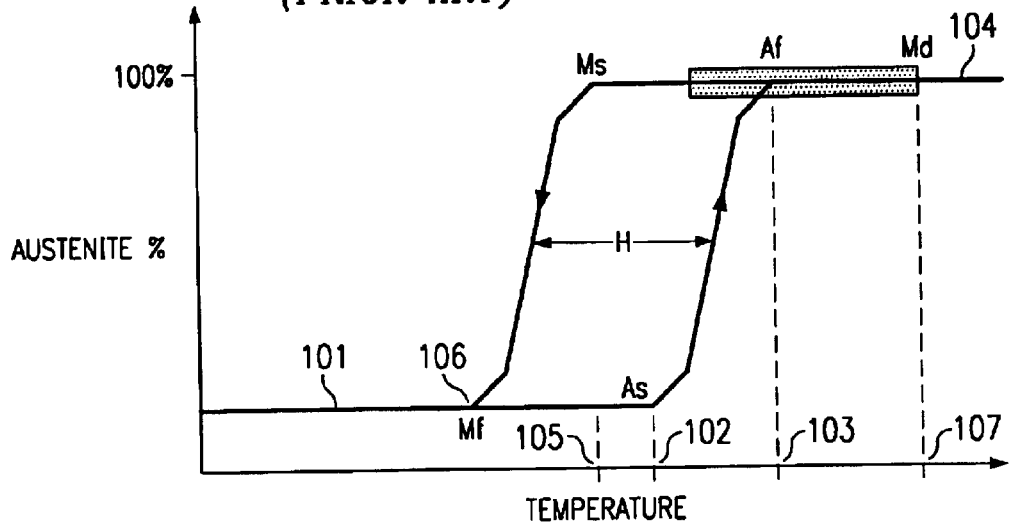
FIG. 1 plots schematically the martensite-to-austenite transformation of TiNi as a function of temperature (heating and cooling), showing a hysteresis and the temperature range of superelasticity.

The fundamental characteristics of NiTi have been summarized in "Biocompatibility Evaluation of Nickel-Titanium Shape Memory Metal Alloy", by Jorma Ryhanen, Univ. of Oulu, Finland, May 7, 1999. The preferred NiTi alloy can exist in two different temperature-dependent crystal structures, "martensite" at lower temperature and "austenite" at higher temperature. Austenite has a simple cubic structure, is strong and hard; martensite has a more complex rhombic structure, is ductile and can be deformed; the elongation to failure is over 25%. In FIG. 1, the percent austenite is plotted schematically as a function of temperature. As illustrated in FIG. 1, upon heating, martensite 101 begins to change into austenite at the "austenite start temperature" As (102). The transformation is completed at the "austenite finish temperature" Af (103). Upon cooling the alloy, austenite 104 begins to change into martensite at the "martensite start temperature" Ms (105). Martensite is completely reverted at the "martensite finish temperature" Mf (106). Between a temperature somewhat lower than Af and the "highest temperature of strain-induced martensite" Md (107), the NiTi alloy is rubber-like "super-elastic". The shaded range in FIG. 1 indicates the temperature range of optimal super-elasticity. Above Md, NiTi is deformed like ordinary alloys by slipping. Below As, the material is martensitic and does not recover. Composition and metallurgical treatments of NiTi have dramatic impacts on the transition temperatures listed above.

Figure 2A:
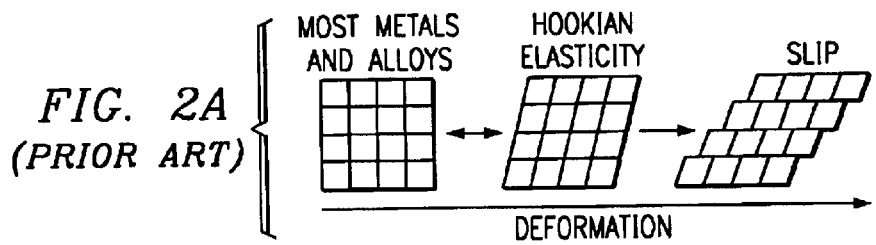
FIG. 2A indicates schematically the changes of lattice structure in stainless steel, caused by outer stress.
Figure 2B:
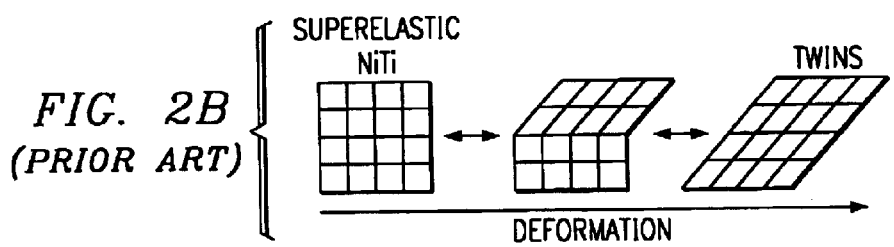
FIG. 2B indicates schematically the changes of lattice structure in TiNi, caused by outer stress.

In FIG. 2, deformation of a solid body is plotted as caused by increasing force. When the Hookian elasticity range is surpassed by increasing outside force or stress, most metals and alloys deform by slip or dislocation (irreversible change) (see FIG. 2A). NiTi responds to stress by changing the orientation of its crystal structure (twinning), where the martensite variants have 24 cystallographically equivalent planes correspond to only one possible austenite parent phase. A NiTi specimen will deform until it consists only of the correspondence variant which produces maximum strain (reversible change). Superelasticity refers to the ability if NiTi to return to its original shape upon unloading after a substantial deformation (see FIG. 2B). This ability is based on stress-induced martensite formation. The application of an outer stress causes martensite to form at temperatures higher than Ms (see FIG. 1). The macroscopic deformation is accommodated by the formation of martensite.

When the stress is released, the martensite transforms back into austenite and the specimen returns back to its original shape (FIG. 2B) Super-elastic NiTi can be strained several times more than ordinary metal alloys without being plastically deformed (rubber-like behavior); about 8% strain can be recovered by unloading.

According to the present invention, in the temperature cycle from −40 to +125° C., the NiTi lower superelastic plateau stress must be below the solder yield stress in order to be effective for postponing failures. The solder yield stress has been published, for two preferred tin alloy solders 63Sn/37Pb (eutectic) and 95.75/Sn3.5Ag/0.75Cu (lead-free), by Masazumi Amagai in "Chip Scale Package Solder Joint Reliability Modeling and Material Characterization" (J. Japan Inst. Electronics Packaging, vol.3, no.1., pp. 45–56, January 2000). Using these data and plotting the yield stress for these two solder alloys in the temperature interval from −40 to +125° C., results in FIG. 3. The yield stress is measured in MPa. A used herein, the term "yield stress" refers to the stress at which normal material leaves the elastic regime and enters the plastic regime.

Figure 3:
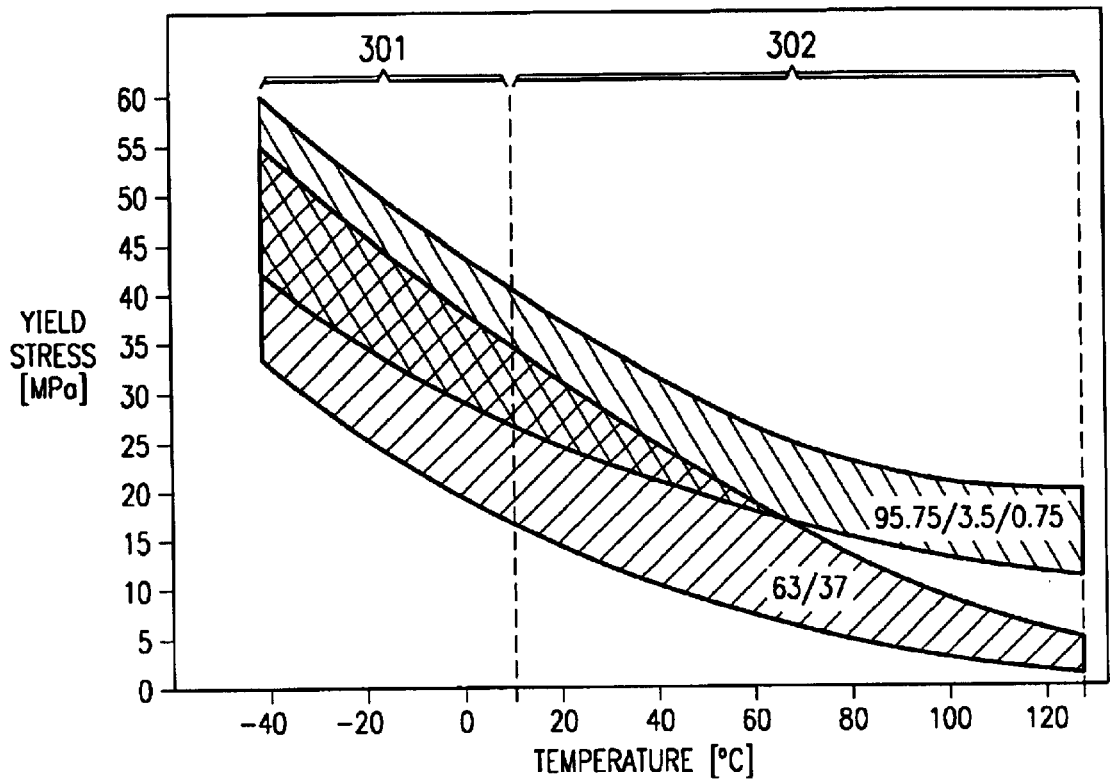
FIG. 3 plots the yield stress of the solder alloys 63Sn/37Pb and 95.75Sn/3.5Ag/0.75Cu in the temperature range from −40 to +125° C., based on data published by Masazumi Amagai, J. Japan Inst. Electronics Packaging, vol. 3, no. 1, pp.45–56, January 2000.

As can be seen in FIG. 3, the yield stress increases strongly in the lower temperature regime 301 (below approximately 10° C.) for both solder alloys. In the higher temperature regime 302 (above approximately 10° C.), the yield stress changes relatively less with temperature.

According to the invention, the NiTi and the reflow alloy are jointly selected so that in the lower temperature regime 301 of the temperature cycle, the NiTi is martensitic with a lower superelastic plateau stress below the yield stress of the reflow alloy. Consequently, the NiTi will deform preferentially. In the higher temperature regime 302 of the temperature cycle, the NiTi will turn austenitic with a yield stress higher than the reflow alloy. Consequently, the reflow alloy will yield preferentially.

Figure 4:
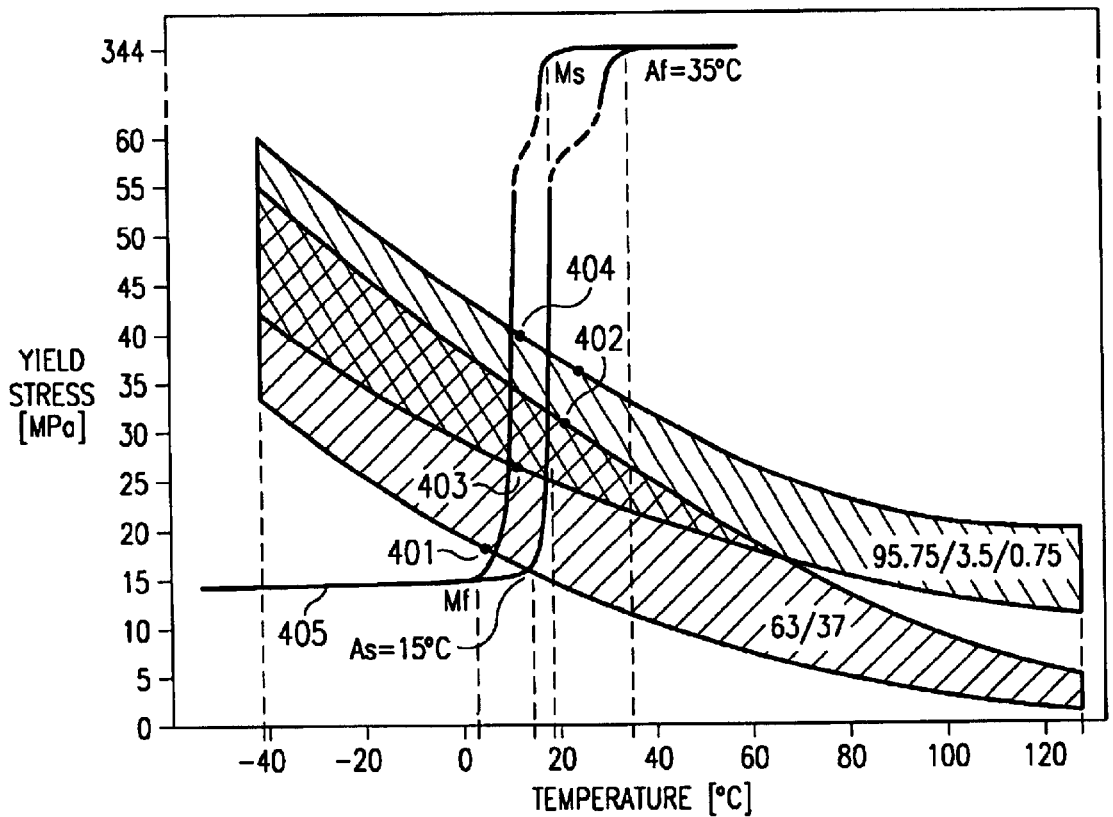
FIG. 4 overlays two yield stress vs. temperature diagrams according to the invention: the curves for two solder alloys, as shown in FIG. 3, and the hysteresis curves for a particular, commercially available NiTi alloy selected specifically so that it represents a best fit to achieve desired 50% mean fatigue life improvement in temperature cycling of flip-chip assembled semiconductor devices.

In order to illustrate the application of the invention, an example is given for the goal of 50% mean fatigue life improvement during a −40 to +125° C. temperature cycle test in 15 min ramps. Calculations indicate the need of a NiTi alloy with a lower superelastic plateau stress for the eutectic solder alloy of 18 to 30 MPa while below 0 to 20° C., and a lower superelastic plateau stress for the lead-free solder alloy of 26.5 to 40 MPa while below 15° C. In FIG. 4, these yield stresses are indicated by asterisks 401 and 402, and 403 and 404, respectively.

FIG. 4 illustrates the best fit of a NiTi hysteresis to match these asterisk target values, when the NiTi hysteresis is overlaid over the solder alloys yield stress regimes depicted in FIG. 3. As approximate temperatures, FIG. 4 indicates the NiTi austenite start temperature As 15° C., the austenite finish temperature 35° C., the martensite start temperature Ms 18° C., and the martensite finish temperature Mf 5° C. The above listed properties are provided, for example, by a NiTi alloy based on 55.5±0.5% Ni called "Body Temperature NiTi Alloy", commercially available from the Special Metals Corp., Shape Memory Alloys Dept., New Hartford, N.Y. This alloy contains maximum 0.05% C, 0.005% H, 0.05% 0, 0.05% Fe, and <0.01% other trace elements. The upper superelastic plateau is at 344 MPa and the lower branch 405 of the hysteresis at 14 MPa. This lower branch 405 is also referred to as "Lower Superelastic Plateau Stress". As FIG. 4 shows, this Lower Superelastic Plateau Stress has to be lower than the yield stress of the eutectic solder as well as the lead-free solder in the temperature regime from about +10 to −40° C. These properties are compatible with deformation of the solder in the temperature cycling range.

Figure 5A:
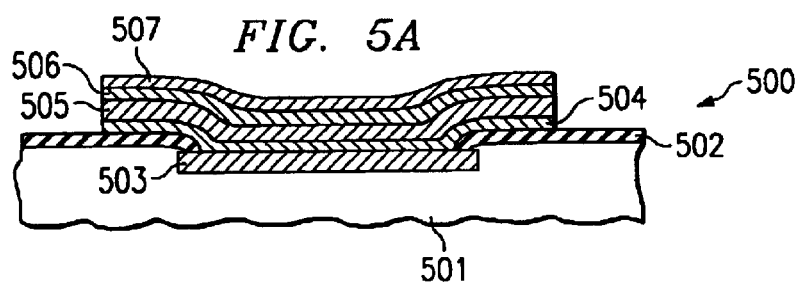
FIG. 5A is a schematic cross section of a portion of an integrated circuit chip having a contact pad with a NiTi layer according to the invention.

The structure of the preferred embodiment of the invention is shown in FIG. 5A by the schematic cross section of a portion, generally designated 500, of an integrated circuit (IC) chip having a contact pad. The surface of chip 501 has an overcoat 502 (typically silicon nitride or silicon oxynitride, sometimes a polymer such a polyimide, about 0.8 to 1.2 μm thick). A window has been opened in this overcoat to expose the chip metallization 503, usually aluminum, copper-doped aluminum, or copper. An additional metal layer 504 establishes ohmic, low resistance contact to metallization 503, reliable, moisture impermeable adhesion to overcoat 502, and ohmic, low resistance contact to the outer NiTi. Preferred choices include refractory metals such as titanium, tungsten, chromium, molybdenum, and alloys thereof in the thickness range from 0.5 to 1.0 μm.

On top of the sealant layer 504 is the NiTi layer 505 in the thickness range from <0.3 to 6.0 μm. The NiTi layer comprises between 55.5 and 56.5 weight % nickel, and between 43.5 and 44.5 weight % titanium. After deposition, the layer has been recrystallized in the temperature range from 450 to 600° C. for a time period between 4 and 6 min in order to have martensite crystalline structure with a Lower Superelastic Plateau Stress which is lower than the yield stress of the reflow attachment (solder).

On top of the NiTi layer 505 is layer 506 made of a wettable metal such as nickel for good solderability. The thickness range is about 0.3 to 0.7 μm. Nickel further acts as a diffusion barrier. The outermost metal is a layer 507 of a noble metal such as palladium, gold, silver, or alloys thereof in the thickness range from 3 to 20 nm. Its purpose is to preserve the solderability of layer 506. Layer 507 may be dissolved in the process of reflow attachment of the device to an external part.

Figure 5B:
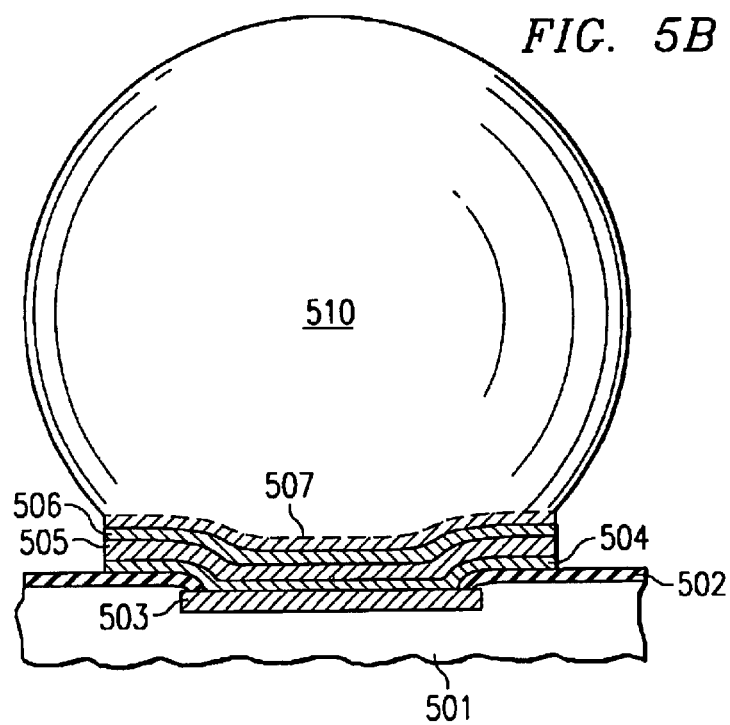
FIG. 5B illustrates the schematic cross section of FIG. 5A after reflow of solder interconnection.

FIG. 5B illustrates the contact pads including the stress-absorbing NiTi layer after the deposition and first reflow of an interconnector (solder) 510 on the contact pad. At this stage, the chip is ready for flip-chip assembly onto an external part. Interconnector 510 comprises a reflowable bump made of tin, indium, tin alloys including tin/indium, tin/silver, tin/bismuth, tin/lead, or conductive adhesives or z-axis conductive materials. At this stage, the IC chip is ready for flip-chip assembly onto an external part. Layer 507, deposited for preserving the solderability of layer 506, has been dissolved in the assembly process.

Figure 6:
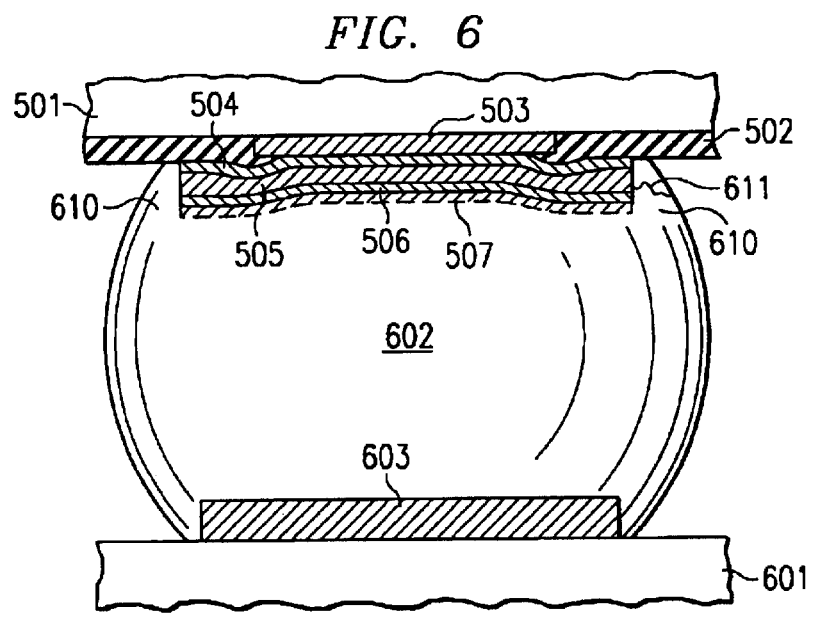
FIG. 6 depicts a schematic cross section of a portion of an integrated circuit chip with the NiTi layer of the invention on a contact pad, after flip-chip assembly onto an external part.

In FIG. 6, the IC chip of FIG. 5B has been assembled by flip-chip technology onto an external part 601, such as a printed wiring board, flexible substrate, or any other suitable substrate material. The means for flip-chip assembly is interconnector 602, which attaches by melting to the solderable metal terminal 603 of external part 601. Retaining the designations of FIG. 5A, the IC chip portion 501 shown in FIG. 6 includes the chip protective overcoat 502, the chip metallization 503, the sealant metal layer 504, the stress-absorbing NiTi layer 505, and the solderable metal layer 506.

The coefficients of thermal expansion of silicon, the most common material for IC chip 501, and the external board 601 are significantly different, in some instances by a factor of 10. Consequently, in temperature excursions such as the traditional cycling between −40 to +125° C., considerable thermomechanical stresses are exerted on the interconnecting bump 602, especially at the solder joint neck area 610. The probability is high that a crack 611 will originate on the solder surface of the neck area 610. This crack 611 can only propagate to the NiTi layer 505, where its energy is absorbed by the elasticity of the NiTi material.

According to the Griffith energy-balance concept for crack formation in brittle solids (first published in 1920), a change in the length of a nascent crack or notch cannot change the sum of all energies; in other words, the sum of surface energy and mechanical energy has to stay constant. This means for a crack extension that the surface energy may generally increase, but the mechanical energy has to decrease. The mechanical energy itself consists of the sum of the strain potential energy stored in the material and the potential energy of the outer applied loading system. This says, whenever any of these energies can assume a lower value, the freed energy can be invested in generating more surface for an expanding crack.

Applying the Griffith equilibrium requirement to semiconductor devices, whenever uniform stress is applied (for instance during operation or testing of the semiconductor device) so that it is larger than the failure stress, a nascent crack may propagate spontaneously and without limit—unless it is stopped or arrested. The failure stress at the crack front, in turn, is proportional to the free surface energy per unit area and to Young's modulus (a material constant), and inverse proportional to the length of the starter crack or notch. Since the solder joints of flip-chip interconnections are well-known areas for the generation of microcracks, they are prime concerns for latent failures of the semiconductor device due to propagating cracks. The present invention comprises the energy-absorbing elasticity of the NiTi layers for arresting solder cracks in semiconductor circuit chips. In general, the crack resistance energy per unit area has been observed to be increasing an order of magnitude.

As calculations show, based on the geometry of the IC chip contact areas and the thickness of the NiTi layer, the electrical resistance added by the NiTi layer is two to three orders of magnitude less than the electrical resistance of a typical gold bonding wire used in semiconductor devices. Consequently, the addition of the NiTi layer has only a minimal effect on the speed of semiconductor devices and is thus quite acceptable.

FIG. 7 shows a block diagram of the preferred wafer-level process flow of manufacturing the NiTi layer, emphasizing the following major steps:

Step 701: Input: IC wafer from the wafer fab. The wafer has a protective overcoat and a plurality of windows in this overcoat to expose the aluminum or copper interconnecting chip metallization.

Step 702: Depositing by sputtering a Ti (or other refractory metal) layer operable to contact the chip metallization and to adhere to the chip protective overcoat;

Step 703: Depositing by DC (160 W/in$^2$) or RF sputtering a NiTi alloy of 55.5±0.5 weight % Ni and 44.5±0.5 weight % Ti; after about 1.0 hr at ambient temperature, the layer is in the thickness range of 4.0±1.5 µm;

Step 704: Recrystallizing the alloy layer at 450 to 600° C. for 4 to 6 min, creating a martensite crystalline structure having a Lower Superelastic Plateau Stress which is lower than the yield stress of the solder attachment, and is operable in reversible phase transitions under thermomechanical stress, whereby mechanical strain is absorbed by the alloy layer;

Step 705: Depositing by sputtering, or by sputtering and electro- or electroless plating, a Ni layer of 0.3 to 0.7 µm thickness to act as a solderable surface and as a diffusion barrier;

Step 706: Depositing by sputtering or by electroplating a layer of palladium, about 0.02 µm thick, or 0.003 to 0.005 µm gold, to preserve the solderability of nickel;

Step 707: Patterning the deposited layers by acid etching to provide solder attach sites;

Step 708: Attaching solder "balls".

Step 709: Output: IC wafers with strain-absorbing layers under solder interconnections.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention can be applied to IC bond pad metallizations other than copper, which are difficult or impossible to contact by conventional tin or solder techniques, such as alloys of refractory metals and noble metals. As another example, the invention can be extended to batch processing, further reducing fabrication costs. As another example, the invention provides freedom to the composition of the NiTi alloy, the thickness of the alloy layer, and the recrystallization temperatures and times. It is therefore intended that the appended claims encompass any such modifications or embodiments.

I claim:

1. An integrated circuit chip having a plurality of contact pads to be connected by reflow attachment to outside parts, comprising:
   a deposited layer of nickel/titanium alloy on each of said pads, said alloy having a composition and crystalline structure operable in reversible phase transitions under thermomechanical stress, whereby mechanical strain is absorbed by said alloy layer; and
   a layer of solderable metal on said alloy, operable as diffusion barrier after said reflow attachment.

2. The chip according to claim 1 wherein said alloy has between 55.0 and 56.0 weight % nickel, and between 44.0 and 45.0 weight % titanium.

3. The chip according to claim 1 wherein said alloy layer as a thickness in the range from about 0.3 to 6.0 µm.

4. The chip according to claim 1 wherein said alloy layer has been recrystallized after deposition in a temperature range from about 450 to 600° C. for a time period between 4 and 6 min.

5. The chip according to claim 1 wherein said crystalline structure is martensite, having a Lower Superelastic Plateau Stress which is lower than the yield stress of said reflow attachment to outside parts.

6. The chip according to claim 1 wherein said martensite crystalline structure deforms, upon application of thermally-induced mechanical stress, by twinning, thus avoiding the yielding of said reflow attachment, and finally converts to austenite, returning back to martensite after removal of said thermomechanical stress.

7. The chip according to claim 1 wherein said reversible phase transitions are operable in the temperature range from −40 to +125° C.

8. The chip according to claim 1 wherein said solderable metal layer is made of nickel and has a thickness in the range from about 0.3 to 0.7 μm.

9. The chip according to claim 1 further comprising an outermost layer of noble metal to retain solderability of said solderable metal layer, said noble metal layer to be dissolved in said reflow attachment process of said chip to said external part.

10. The chip according to claim 9 wherein said noble metal is selected from a group consisting of palladium, gold, silver, and alloys thereof, in the thickness range from about 3 to 20 nm.

11. The chip according to claim 1 wherein said chip has a protective overcoat layer, wherein said plurality of contact pads are opened into said overcoat, exposing the chip metallization.

12. The chip according to claim 11 wherein said chip metallization is copper-doped aluminum.

13. The chip according to claim 11 wherein said chip metallization is copper or copper alloy.

14. The chip according to claim 11 further comprising a layer of refractory metal between said chip metallization and said alloy layer to ensure adhesion of said alloy layer to said protective overcoat.

15. The chip according to claim 14 wherein said refractory metal is selected from a group consisting of titanium, tungsten, chromium, molybdenum, and alloys thereof.

16. The chip according to claim 1 further comprising interconnectors operable to assemble said chip onto said outside part.

17. The chip according to claim 16 wherein said interconnectors are reflowable bumps made of tin, indium, tin alloys including tin/indium, tin/silver, tin/bismuth, tin/lead, conductive adhesives, or z-axis conductive materials.

18. The chip according to claim 1 wherein said outside parts comprise printed circuit boards, flexible substrates, or any other suitable substrate material.

19. A metallurgical interconnection attaching an electronic device having first coefficient of thermal expansion to an outside body having second coefficient of thermal expansion, comprising:

an electronic device having a plurality of contact pads exposing the device metallization;

each of said contact pads having a layer of nickel/titanium alloy deposited over said device metallization, followed by a solderable nickel barrier layer;

a solder bump attached to said solderable layer of each contact pad;

said outside body having a plurality of terminal pads located in positions respective to said device contact pads, said terminals exposing the metallization of said outside body;

said device attached to said outside body so that said contact pads are aligned with said respective terminal pads, whereby a plurality of metallurgical interconnections are formed operable to absorb, in said nickel/titanium layer, strain caused by thermomechanical stress due to the difference between said first and second coefficients of thermal expansion.

20. A metallurgical interconnection attaching an outside body having first coefficient of thermal expansion to an electronic device having second coefficient of thermal expansion, comprising:

an outside body having a plurality of terminal pads exposing the body metallization;

each of said terminal pads having a layer of nickel/titanium alloy deposited over said body metallization, followed by a solderable barrier layer;

a solder bump attached to said solderable layer of each terminal pad;

said electronic device having a plurality of contact pads located in positions respective to said body terminal pads, said contacts exposing the metallization of said device;

said device attached to said outside body so that said contact pads are aligned with said respective terminal pads, whereby a plurality of metallurgical interconnections are formed operable to absorb, in said nickel/titanium layer, strain caused by thermomechanical stress due to the difference between said first and second coefficients of thermal expansion.

21. An integrated circuit device including a plurality of contact pads, comprising:

a layer of nickel/titanium alloy on each of said pads, said alloy having a composition of between about 55.5 and about 56.5 weight % nickel and between about 43.5 and about 44.5 weight % titanium; and a layer of solderable metal over said alloy.

22. The device of claim 21, wherein said alloy layer has a thickness in the range of about 0.3 to about 6.0 μm.

23. The device of claim 21, wherein said solderable metal is nickel.

24. The device of claim 21, further comprising a solder bump on said solderable metal.

* * * * *